United States Patent
Denais et al.

(10) Patent No.: US 7,498,863 B2
(45) Date of Patent: Mar. 3, 2009

(54) COMPENSATION FOR ELECTRIC DRIFTS OF MOS TRANSISTORS

(75) Inventors: Mickael Denais, Grenoble (FR); Vincent Huard, Meylan (FR); Chittoor Parthasarathy, Grenoble (FR)

(73) Assignee: STMicroelectronics Crolles 2 SAS, Crolles (FR)

( * ) Notice: Subject to any disclaimer, the term of this patent is extended or adjusted under 35 U.S.C. 154(b) by 246 days.

(21) Appl. No.: 11/468,672

(22) Filed: Aug. 30, 2006

(65) Prior Publication Data

US 2007/0057688 A1 Mar. 15, 2007

(30) Foreign Application Priority Data

Aug. 31, 2005 (FR) ................................. 05 52638

(51) Int. Cl.
*H03K 17/687* (2006.01)
(52) U.S. Cl. ........................... 327/427; 327/534
(58) Field of Classification Search .............. 327/427, 327/534–537
See application file for complete search history.

(56) References Cited

U.S. PATENT DOCUMENTS

| | | | | |
|---|---|---|---|---|
| 3,609,414 A | | 9/1971 | Pleshko et al. ............ 307/310 |
| 5,099,146 A | * | 3/1992 | Miki et al. ................. 327/77 |
| 5,397,934 A | * | 3/1995 | Merrill et al. ............. 327/537 |
| 6,075,404 A | * | 6/2000 | Shindoh et al. ........... 327/537 |
| 6,091,283 A | * | 7/2000 | Murgula et al. ........... 327/537 |
| 6,353,357 B1 | * | 3/2002 | Kaiser et al. ............. 327/537 |
| 7,030,637 B2 | * | 4/2006 | Berthold et al. .......... 324/763 |

FOREIGN PATENT DOCUMENTS

EP 1 396 777 A1 3/2004

OTHER PUBLICATIONS

H.N. Leighton, "Back Gate Control Circuits," IBM Technical Disclosure Bulletin, vol. 27, No. 6, Nov. 1984, pp. 3607-3608.

* cited by examiner

*Primary Examiner*—Lincoln Donovan
*Assistant Examiner*—William Hernandez
(74) *Attorney, Agent, or Firm*—Lisa K. Jorgenson; Robert Iannucci; Seed IP Law Group PLLC

(57) ABSTRACT

An integrated circuit comprising at least one MOS-type transistor, further comprising a system for detecting the variations of the electrical quantities of the at least one transistor, and a biasing device modifying the bias voltage of the bulk of the at least one transistor according to the variations measured by the detection system.

21 Claims, 3 Drawing Sheets

COMPENSATION FOR ELECTRIC DRIFTS OF MOS TRANSISTORS

BACKGROUND OF THE INVENTION

1. Field of the Invention

The present invention relates to an integrated circuit comprising MOS-type transistors.

2. Description of the Related Art

The technological progress of methods for manufacturing integrated circuits and in particular circuits comprising MOS-type transistors generally goes along with a decrease in the surface area taken up by each transistor. The drain, source, and channel surface areas, as well as the gate oxide thickness, are decreased. This geometric decrease generally goes along with a decrease in the bias voltage of the integrated circuit components. However, the bias voltage of transistors decreases proportionally slower than the thickness of their gate oxide, to avoid decreasing their switching speed, or even to increase it.

This faster gate oxide thickness decrease results in increasing the average electric field crossing a gate oxide. This causes "degradations" of the transistors along their use and a decrease in their switching speed. Such physical degradations correspond to an increase in the equivalent drain-source resistance of the transistors and a decrease in their switching speed.

Accordingly, a fast gate oxide thickness decrease, to have high switching speeds, results in reliability problems and variations in the electric characteristics of the transistors along their use.

Such variations are particularly disturbing for certain types of circuits. For the latter, it is then necessary to provide transistors exhibiting thicker gate oxides, to the detriment of their switching speed.

BRIEF SUMMARY OF THE INVENTION

One embodiment of the present invention provides an integrated circuit comprising "fast" switching MOS transistors while exhibiting stable electric characteristics.

One embodiment of the present invention provides such a circuit that is of simple structure.

One embodiment of the present invention provides an integrated circuit comprising at least one MOS-type transistor, a system for detecting the variations of the electrical quantities of said at least one transistor, and a biasing device modifying the bias voltage of the bulk of said at least one transistor according to the variations measured by the detection system.

In an embodiment of the above-mentioned integrated circuit, the detection system comprises a monitor MOS-type transistor; a control device applying between the gate and the source of the monitor transistor a control voltage representative of the gate-source voltage applied to said at least one transistor; a device for measuring a monitor value such as the current or the drain-source voltage of the monitor transistor; a reference device generating a reference value corresponding to the value which would be measured on the monitor transistor if the electric characteristics thereof remained unchanged; and a device for comparing the monitor and reference values, the bias device applying to the bulk of the monitor transistor and of said at least one transistor a bias voltage varying according to the value difference recorded by the comparison device.

In an embodiment of the above-mentioned integrated circuit, said at least one transistor and the monitor transistor are PMOS-type transistors.

In an embodiment of the above-mentioned integrated circuit, the measurement device is formed of a resistor placed between the drain of the monitor transistor and the ground, the source of the monitor transistor being connected to a supply voltage of the integrated circuit, and the reference device is formed of two resistors placed in series between the supply voltage and the ground, the monitor value being the voltage at the intermediary node between the drain of the monitor transistor and the resistor of the measurement device, and the reference value being the voltage at the intermediary node between the resistors of the reference device.

In one embodiment of the above-mentioned integrated circuit, the comparison device comprises two branches each formed of a resistor and of first and second NMOS-type transistors, the resistor being placed between the supply voltage and the drain of the first transistor, the source of the first transistor being connected to the drain of the second transistor and the source of the second transistor being grounded, the gates of the two second transistors being connected to each other as well as to the drain of the second transistor of the first branch, the gates of the first transistors being respectively connected to the intermediary node between the resistor and the monitor device of the measurement device and to the intermediary node between the two resistors of the reference device, the drain of the second transistor of the second branch forming the output of the comparison device and being connected to the biasing device.

In an embodiment of the above-mentioned integrated circuit, the biasing device comprises an NPN-type bipolar transistor and a resistor in series between the supply voltage and the ground, the intermediary node between the drain of the bipolar transistor and the resistor being connected to the bulk of the monitor transistor and of said at least one transistor, and the base of the bipolar transistor being connected to the output of the comparison device.

The foregoing and other features and advantages of the present invention will be discussed in detail in the following non-limiting description of specific embodiments in connection with the accompanying drawings.

DETAILED DESCRIPTION OF THE INVENTION

Figure 1:
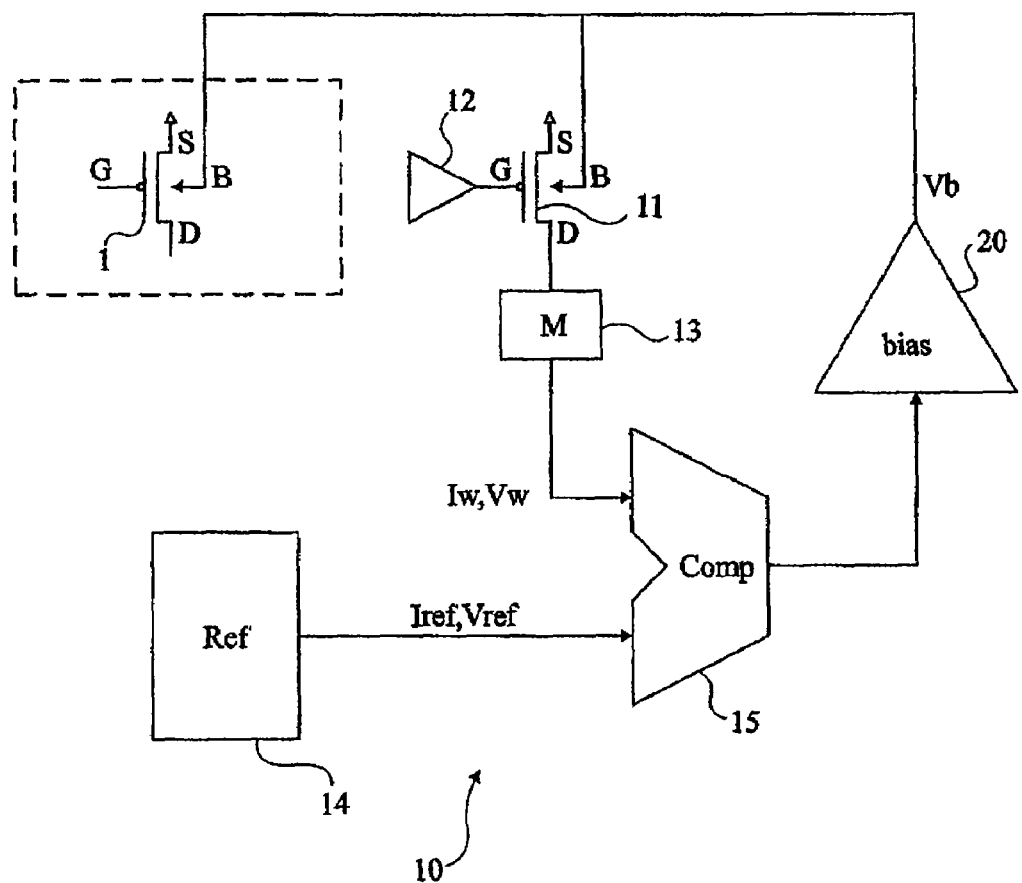
FIG. 1 is a diagram of an integrated circuit according to the present invention.

For clarity, the same elements have been designated with the same reference numerals in the different drawings.

An integrated circuit according to one embodiment of the present invention comprises at least one MOS-type transistor, the electric characteristics of which are desired to be "stabilized". The integrated circuit further comprises a system for detecting the degradations of the transistors "to be stabilized" connected to a device for biasing the bulk of these transistors. By applying a higher or lower voltage to the bulk of these transistors, it is possible to cancel or to compensate for the drifts in their electric characteristics.

For a P-channel MOS transistor (PMOS), a decrease in the voltage of its bulk with respect to the voltage of its source enables decreasing its threshold voltage and decreasing equivalent resistance Ron of the transistor between its source and its drain. This enables increasing the source-drain voltage and the transistor switching speed. Conversely, an increase in the voltage of its bulk with respect to that of its source enables decreasing its switching speed.

For an N-channel MOS transistor (NMOS), an increase in the voltage of its bulk with respect to the voltage of its source enables decreasing equivalent resistance Ron of the transistor between its source and its drain. This enables increasing the source-drain current, and the transistor switching speed. Conversely, a decrease in the voltage of its bulk with respect to that of its source enables decreasing its switching speed.

It should be noted that a variation in the bulk-source voltage of a MOS transistor by a few hundreds of mV generally enables obtaining a variation by a few tens of mV of its threshold voltage. The "natural" drift in the threshold voltage of a PMOS transistor exhibiting a 0.10 µm gate length is in average 50 mV in 10 years of use. A variation in bias voltage Vb of approximately 200 mV enables "erasing" this natural drift.

FIG. 1 is a diagram of an embodiment of an integrated circuit according to the present invention. The functional portion, that is, the portion performing the integrated circuit function, is represented by a square in dotted lines. This functional portion comprises at least one MOS transistor, the electric characteristics of which are desired to be stabilized, in this example, a PMOS transistor 1. The stabilization of transistor 1 consists among others of managing for its switching speed to be substantially constant. Source S of transistor 1 is in this example connected to a supply voltage Vdd of the integrated circuit. Bulk B of transistor 1 is connected to a bias voltage Vb. Gate G and drain D of transistor 1 are connected to other components of the integrated circuit.

In this embodiment of the present invention, a system 10 for detecting the degradations of transistor 1 comprises a monitor MOS transistor 11 of the same type as transistor 1, that is, PMOS in this example. A control device 12 applies between the gate and the source of the monitor transistor a control voltage which is representative of the gate/source voltage applied to transistor 1 during its use. A measurement device 13 is connected to monitor transistor 11 to measure one of its electrical quantities such as its current or its drain-source voltage. Monitor current Iw, monitor voltage Vw, or generally the monitor value measured by measurement device 13, is provided to a comparison device 15. Further, a reference device 14 provides a reference current Iref, a reference voltage Vref, or generally a reference value to comparison device 15. The reference value provided by the reference device corresponds to the value which would be measured on the monitor transistor if the electric characteristics thereof were stable and remained unchanged.

Detection system 10 is connected to a biasing device 20. According to the value difference recorded by comparison device 15, biasing device 20 provides a greater or smaller bias voltage Vb to bias bulks B of transistors 1 and 11 to a voltage enabling overcoming drifts in their electric characteristics.

In this example of embodiment, measurement device 13 is connected to drain D of monitor transistor 11. However, it may be connected to one or several other terminals of monitor transistor 11. Similarly, control device 12 is only connected to gate G of monitor transistor 11. It may however be connected to the gate and possibly to source S of monitor transistor 11. The source of monitor transistor 11 is in the example connected to supply voltage Vdd of the integrated circuit.

The voltage applied by control device 12 may be constant and for example correspond to the average value of the gate/source voltage applied on transistor 1 during use thereof. The voltage applied by control device 12 may also be variable and for example be a "copy" of the source-gate voltage applied to transistor 1.

Further, the measurement device and the comparison device may operate continuously or perform measurements and comparisons in punctual fashion, for example, at regular intervals.

When the value, Iw or Vw, measured by measurement device 13, depends on the bias conditions of monitor transistor 11, the reference value, Iref or Vref, which is stable and unique, is selected to correspond to a value Iw or Vw of the monitor transistor in a predefined bias state. In this case, prior to the measurement of the monitor value by measurement device 13, it is necessary to bias the monitor transistor to this predefined bias state to measure a monitor value, Iw or Vw, that can be compared with the reference value, Iref or Vref.

As an example, if measurement device 13 measures the source/drain current of monitor transistor 11, the measured monitor value Iw varies according to the gate/source voltage applied to monitor transistor 11. Accordingly, to be able to compare it with a reference current Iref having a stable predefined value the value Iw is monitored for a predefined gate/source voltage.

When the voltage applied by control device 12 is constant, this voltage corresponds to a predefined gate/source voltage for the measurement of the monitor value, Iw or Vw. When the voltage applied by the control device is variable, this voltage must, prior to any measurement performed by measurement device 13, be momentarily made constant, and equal to a predefined gate/source voltage.

Figure 2:
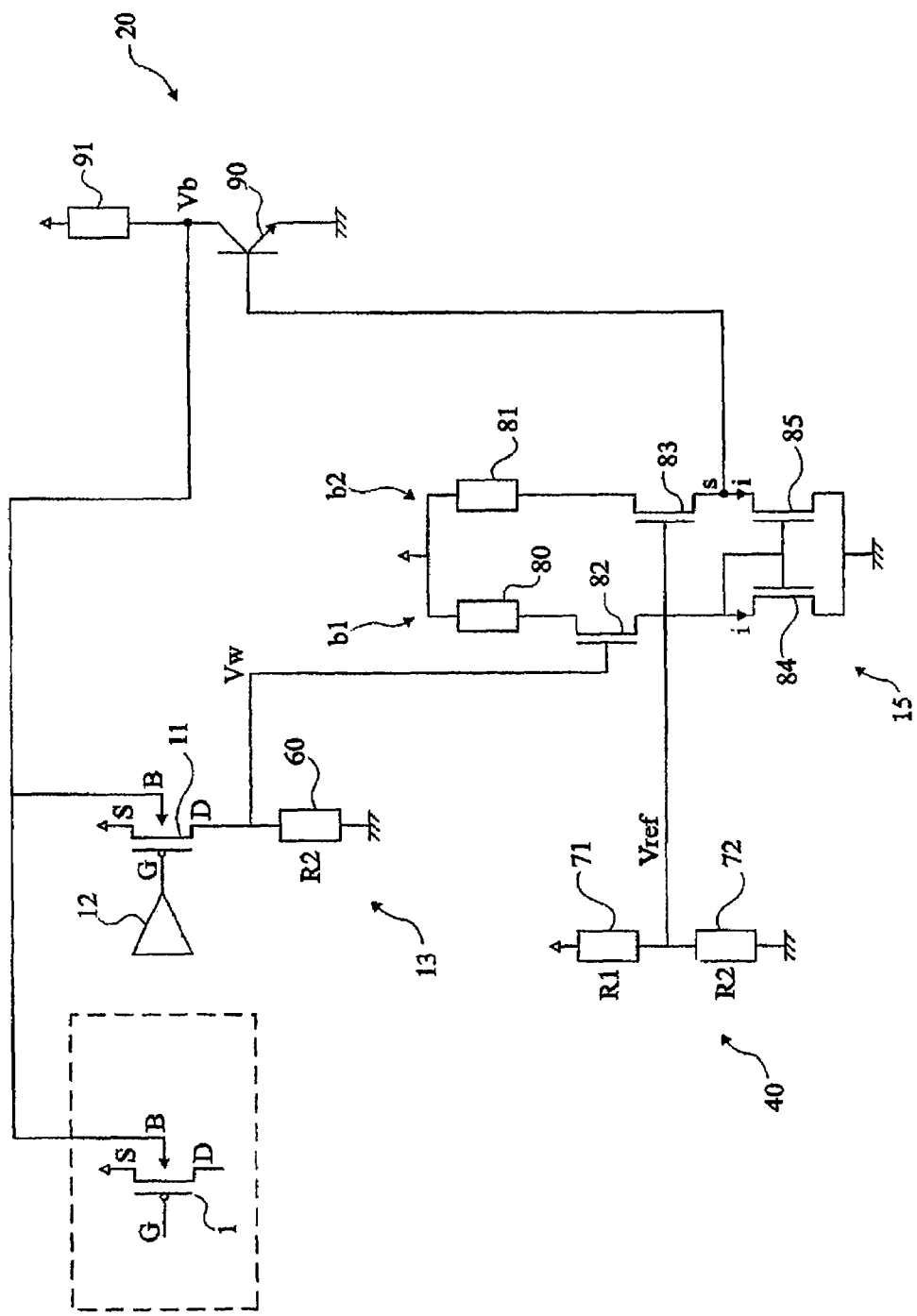
FIG. 2 is a more detailed diagram of the circuit shown in FIG. 1.

FIG. 2 is an example of a circuit according to the present invention in which examples of the forming of devices 13, 14, 15, and 20 are shown.

Measurement device 13 is in this example formed of a resistor 60 placed between the drain of monitor transistor 11 and a first voltage reference of the integrated circuit, in this case the first voltage reference being the integrated circuit ground. The monitor transistor has its source connected to a second voltage reference of the integrated circuit, which in this case is the supply voltage Vdd of the integrated circuit. Reference device 14 is formed of two resistors 70 and 71 in series between the first voltage reference, which in this case is ground, and a second voltage reference, which in this case is the supply voltage Vdd, resistor 70 being on the ground side. Comparison device 15 is formed of two branches b1 and b2, each formed of a resistor 80, 81, and of two NMOS transistors 82/84 and 83/85. For each branch, resistor 80, 81 is placed between supply voltage Vdd and the drain of transistor 82, 83. The source of transistor 82, 83 is connected to the drain of transistor 84, 85. The gates of transistors 84 and 85 are connected to each other and connected to the drain of transistor 84 of branch b1. The gates of transistors 82 and 83 are respectively connected to measurement device 13 and to reference device 14, and more specifically to the intermediary node between the drain of monitor transistor 2 and resistor 60 and to the intermediary node between resistors 70 and 71. Bias device 20 is in this example formed of an NPN-type bipolar transistor 90 and of a resistor 91. Resistor 91 is placed between supply voltage Vdd of the integrated circuit and the collector of bipolar transistor 90. The emitter of bipolar transistor 90 is grounded. The base of bipolar transistor 90 is connected to comparison device 15, and more specifically to intermediary node s between transistors 83 and 85 of branch b2 of the comparison device.

The value measured by measurement device 20 is in this example a monitor voltage Vw and the reference value provided by reference device 14 is a reference voltage Vref. The values of resistors 60 and 70 of the measurement and reference devices are identical and equal to R2. Value R1 of resistor 71 corresponds to the equivalent source-drain resistance Ron of monitor transistor 11 in its initial state and submitted to a predefined source/gate voltage. The initial state of monitor transistor 11 corresponds to its state before use or, in other words, before degradation of its electric characteristics.

When monitor transistor 11 is in its initial state, monitor transistor Vw and reference voltage Vref are equal. When the characteristics of monitor transistor 11 modify, the drain/source voltage tends to decrease and monitor voltage Vw decreases.

Comparison device 15 comprises a current mirror formed by transistors 84 and 85. Each branch b1 and b2 is thus crossed by a substantially identical current i which is a function of monitor voltage Vw applied to transistor 82. The components of the comparison device are selected so that initially, when monitor voltage Vw and reference voltage Vref are identical, the voltage at node s is very low. When voltage Vw decreases, current i decreases and the voltage at output node s tends to increase. Bipolar transistor 90 is more and more conductive. The current crossing resistor 91 increases, as well as the voltage thereacross, which causes a decrease in the voltage Vb applied to bulks B of transistors 1 and 11.

The operation of previously-described detection system 10 is that corresponding to a progressive degradation of the characteristics of PMOS transistors 1 and 11. However, this same system may be used to overcome temporary drifts in the electric characteristics of transistors 1 and 11, for example, on overheating thereof. In this last case, monitor voltage Vw may exhibit positive or negative voltage peaks which translate increases or decreases in the source/drain current of monitor transistor 11 and thus in its switching speed. Such switching speed variations are then compensated for by increasing or decreasing bias voltage Vb.

Further, the reference value, Iref or Vref, generated by reference device 14 must be generated by means of an assembly of components exhibiting stable electric characteristics. Resistor 71 for example is a doped semiconductor portion or a doped polysilicon portion.

Of course, the present invention is likely to have various alterations, modifications, and improvements which will readily occur to those skilled in the art. In particular, those skilled in the art may devise other embodiments of the system for detecting the variations of the electrical quantities of the transistors, the electric behavior of which is desired to be stabilized, as well as other embodiments of the bias device.

Further, those skilled in the art may devise other embodiments of the devices of measurement, reference, comparison, and biasing of the detection system shown in FIG. 1.

Figure 3:
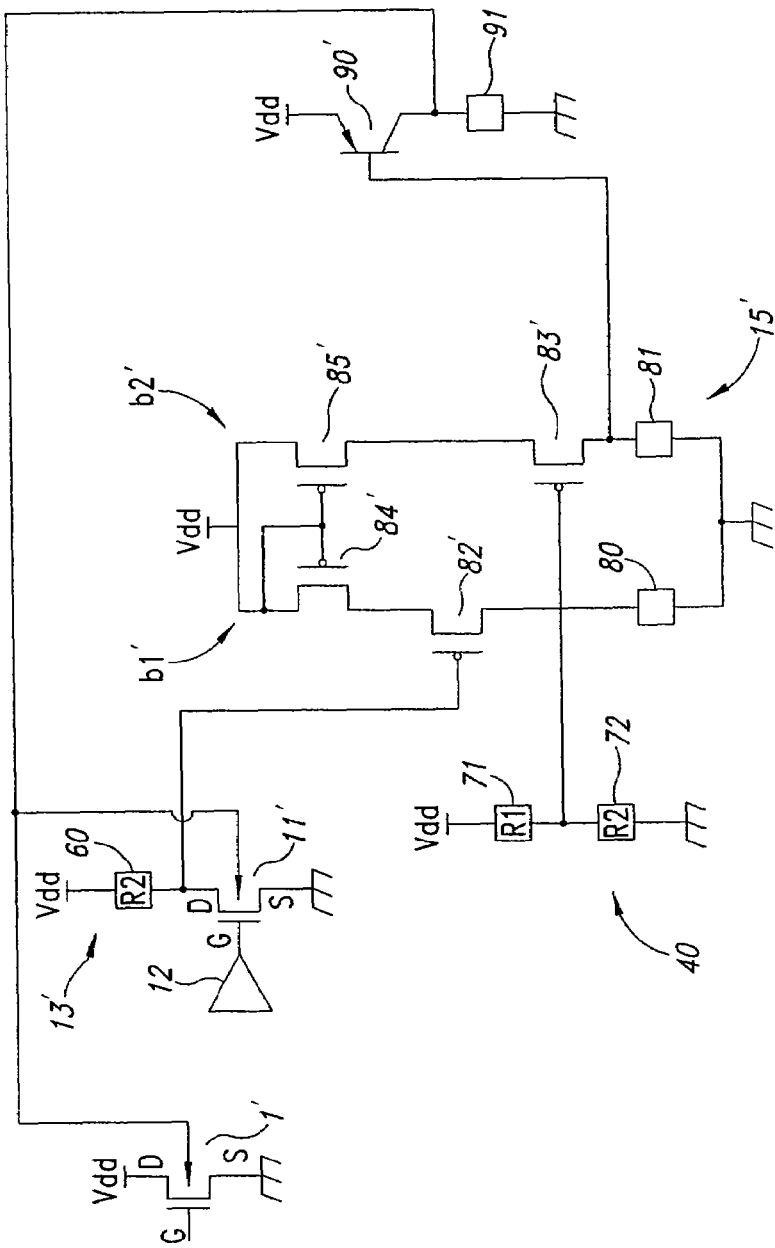
FIG. 3 is a detailed diagram of the circuit shown in FIG. 1, according to an alternate embodiment.

Moreover, as shown in FIG. 3, the detection system and the bias device shown in FIG. 2 may be adapted in the case where the transistors 1', the electric behavior of which is desired to be stabilized, are of NMOS type. An NMOS-type monitor transistor 11' is then used. The measurement device 13' is then formed of a resistor 50 placed between the drain of NMOS monitor transistor 11' and a first voltage reference, which in this case is the supply voltage Vdd of the integrated circuit. The source of NMOS monitor transistor 11' is connected to a second voltage reference, which in this case is the ground of the integrated circuit. A comparison device 15' "complementary" to that shown in FIG. 2 may be formed from PMOS-type transistors 82, 83, 84, 85, the resistors 80, 81 being then grounded and the transistors 84, 85 forming the current mirror connected to supply voltage Vdd. The bias voltage may be formed of a PNP bipolar transistor 90' and of a resistor 91 placed between the ground and the collector of the bipolar transistor.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. An integrated circuit comprising:
   at least one MOS-type transistor;
   a detector structured to detect a variation of an electrical quantity of said at least one transistor; and
   a biasing device structured to modify a bias voltage of a bulk of said at least one MOS-type transistor according to the variation measured by the detector, wherein the detector comprises:
   a MOS-type monitor transistor;
   a measurement device structured to measure a monitor value of the monitor transistor, wherein the measurement device is formed of a resistor placed between a drain of the monitor transistor and a first voltage reference, a source of the monitor transistor being connected to a second voltage reference, the monitor value being a voltage at a first intermediary node between the drain of the monitor transistor and the resistor of the measurement device;
   a reference device structured to generate a reference value corresponding to a value which would be measured on the monitor transistor if electric characteristics thereof remained unchanged, wherein the reference device is formed of two resistors placed in series between the first voltage reference and the second voltage reference, and the reference value being a voltage at a second intermediary node between the resistors of the reference device;
   a comparison device structured to compare the monitor and reference values and measure a value difference between the monitor and reference values, the biasing device being structured to apply to a bulk of the monitor transistor and the bulk of said at least one transistor the bias voltage which varies according to the value difference measured by the comparison device; and
   a control device structured to apply between a gate and the source of the monitor transistor a control voltage representative of a gate-source voltage applied to said at least one MOS-type transistor.

2. The integrated circuit of claim 1, wherein the resistor of said measurement device has a resistance value substantially equal to a resistance value of a first one of two resistors of the reference device.

3. The integrated circuit of claim 2, wherein a second one of the two resistors of the reference device has a resistance value corresponding to an equivalent source-drain resistance of the monitor transistor for a determined source/gate voltage when the electric characteristics of the monitor transistor remain unchanged.

4. The integrated circuit of claim 1, wherein said at least one MOS-type transistor and the monitor transistor are PMOS-type transistors, wherein said first voltage reference is ground, and wherein the second voltage reference is a supply voltage of the integrated circuit.

5. The integrated circuit of claim 1, wherein said at least one MOS-type transistor and the monitor transistor are of NMOS-type, wherein said first voltage reference is a supply voltage of the integrated circuit, and wherein the second voltage reference is ground.

6. The integrated circuit of claim 1, wherein the comparison device comprises first and second branches, each formed of a branch resistor and of NMOS-type first and second transistors, the branch resistor being placed between the supply voltage and a drain of the first transistor, a source of the first transistor being connected to a drain of the second transistor and a source of the second transistor being grounded, the two second transistors having gates connected to each other as well as to the drain of the second transistor of the first branch, first transistors having gates respectively connected to the first intermediary node between the resistor and the monitor transistor of the measurement device and to the second intermediary node between the two resistors of the reference device, the second transistor of the second branch having a drain forming an output of the comparison device and being connected to the biasing device.

7. The integrated circuit of claim 1, wherein the biasing device comprises an NPN-type bipolar transistor and a resistor in series between the supply voltage and the ground, a third intermediary node between a collector of the bipolar transistor and the resistor of the biasing device being connected to the bulk of the monitor transistor and the bulk of said at least one transistor, and a base of the bipolar transistor being connected to the output of the comparison device.

8. The integrated circuit of claim 7, wherein the control voltage is constant.

9. The integrated circuit of claim 7, wherein the control voltage is, outside of phases of measurement by the measurement device, equal to a gate/source voltage applied to said at least one transistor and equal, in phases of measurement by the measurement device, to a predefined constant voltage.

10. An integrated circuit comprising:
   a monitored transistor having a gate, source, drain, and bulk;
   a monitor transistor coupled to the monitored transistor and having a gate, source, drain, and bulk;
   a detector structured to detect a variation of an electrical quantity of the monitor transistor; and
   a biasing device structured to modify a bias voltage of the bulk of the monitored transistor according to the variation detected by the detector, wherein the detector includes:
   a measurement device structured to measure a monitor value of the monitor transistor;
   a reference device structured to generate a reference value corresponding to an initial monitor value of the monitor, the reference device including first and second resistances connected to one another at a first intermediary node;
   a comparator connected to the measurement device and the first intermediary node and structured to measure a value difference between the monitor and reference values, the biasing device applying to a bulk of the monitor transistor and the bulk of the monitored transistor the bias voltage which varies according to the value difference measured by the comparator; and
   a control device structured to apply between the gate and source of the monitor transistor a control voltage representative of a gate-source voltage applied to the monitored transistor.

11. The integrated circuit of claim 10, wherein the control voltage is constant.

12. The integrated circuit of claim 10, wherein the control voltage is a constant voltage during a measurement phase in which the detector detects the variation of the electrical quantity and the control voltage is equal to a gate/source voltage applied to the monitored transistor when not in the measurement phase.

13. The integrated circuit of claim 10, wherein the measurement device includes a resistor connected in series with the monitor transistor between first and second supply voltage terminals, and wherein the first and second resistances are in series between the first and second supply voltage terminals, the monitor value being a voltage at a second intermediary node between the monitor transistor and the resistor of the measurement device, and the reference value being a voltage at the first intermediary node.

14. The integrated circuit of claim 13, wherein the comparator comprises:
   a first branch that includes a first branch resistor and first and second transistors, the first branch resistor being connected between the first supply voltage terminal and the first transistor, the first transistor having a gate coupled to the second intermediary node, and the second transistor being connected between the first transistor and the second supply voltage terminal and having a gate and a conduction terminal coupled to one another; and
   a second branch that includes a second branch resistor and third and fourth transistors, the second branch resistor being connected between the first supply voltage terminal and the third transistor, the third transistor having a gate coupled to the first intermediary node, and the fourth transistor being connected between the third transistor and the second supply voltage terminal and having a gate coupled to the gate of the second transistor, and a conduction terminal forming an output of the comparison device and being connected to the biasing device.

15. The integrated circuit of claim 14, wherein the biasing device comprises a bipolar transistor and a resistor in series between the first and second supply voltage terminals, a third intermediary node between the bipolar transistor and the resistor of the biasing device being connected to the bulk of the monitor transistor and the bulk of the monitored transistor, and a base of the bipolar transistor being connected to the output of the comparison device.

16. The integrated circuit of claim 10, wherein the monitored transistor and the monitor transistor are PMOS transistors.

17. An integrated circuit comprising:
   a monitored transistor having a gate, source, drain, and bulk;
   a monitor transistor coupled to the monitored transistor and having a gate, source, drain, and bulk; and
   detector structured to detect a variation of an electrical quantity of the monitor transistor, the detector including:
   a measurement device structured to measure a monitor value of the monitor transistor;
   a reference device generating a reference value corresponding to an initial monitor value of the monitor, the reference device including first and second resistances connected to one another at a first intermediary node;
   a comparator connected to the measurement device and the first intermediary node and structured to measure a value difference between the monitor and reference values; and
   a control device structured to apply between the gate and source of the monitor transistor a control voltage representative of a gate-source voltage applied to the monitored transistor.

18. The integrated circuit of claim 17, further comprising a biasing device structured to modify a bias voltage of the bulk of the monitored transistor according to the variation detected by the detector.

19. The integrated circuit of claim 17, wherein the control voltage is a constant voltage during a measurement phase in which the detector detects the variation of the electrical quantity and the control voltage is equal to a gate/source voltage applied to the monitored transistor when not in the measurement phase.

20. The integrated circuit of claim 17, wherein the measurement device includes a resistor connected in series with the monitor transistor between first and second supply voltage terminals, and wherein the first and second resistances are in series between the first and second supply voltage terminals, the monitor value being a voltage at a second intermediary node between the monitor transistor and the resistor of the measurement device, and the reference value being a voltage at the first intermediary node.

21. The integrated circuit of claim 20, wherein the comparator comprises:

a first branch that includes a first branch resistor and first and second transistors, the first branch resistor being connected between the first supply voltage terminal and the first transistor, the first transistor having a gate coupled to the second intermediary node, and the second transistor being connected between the first transistor and the second supply voltage terminal and having a gate and a conduction terminal coupled to one another; and a second branch that includes a second branch resistor and third and fourth transistors, the second branch resistor being connected between the first supply voltage terminal and the third transistor, the third transistor having a gate coupled to the first intermediary node, and the fourth transistor being connected between the third transistor and the second supply voltage terminal and having a gate coupled to the gate of the second transistor, and a conduction terminal forming an output of the comparison device and being connected to the biasing device.

* * * * *